United States Patent
Takehara

(10) Patent No.: US 6,476,507 B1
(45) Date of Patent: Nov. 5, 2002

(54) RESIN SEALING METHOD AND RESIN SEALING APPARATUS

(75) Inventor: Masataka Takehara, Kyoto (JP)

(73) Assignee: Towa Corporation, Kyoto (JP)

( * ) Notice: Subject to any disclaimer, the term of this patent is extended or adjusted under 35 U.S.C. 154(b) by 5 days.

(21) Appl. No.: 09/633,071

(22) Filed: Aug. 4, 2000

(30) Foreign Application Priority Data

Aug. 10, 1999 (JP) .............................. 11-225873

(51) Int. Cl.[7] .......................... H01L 23/28; H01L 23/29
(52) U.S. Cl. ...................... 257/787; 257/790; 257/723
(58) Field of Search ................................. 257/787, 790, 257/723; 438/112, 124, 127; 361/760, 783; 174/260, 52.3

(56) References Cited

U.S. PATENT DOCUMENTS 5,854,740 A * 12/1998 Cha ........................... 361/760

FOREIGN PATENT DOCUMENTS

| JP | 04044347 | 2/1992 |
|---|---|---|
| JP | 04320052 | 11/1992 |
| JP | 06053362 | 2/1994 |
| JP | 07022471 | 1/1995 |
| JP | 07045655 | 2/1995 |
| JP | 08306723 | 11/1996 |
| JP | 09069600 | 3/1997 |
| JP | 2000 156435 | 6/2000 |

* cited by examiner

Primary Examiner—Jasmine J B Clark
(74) Attorney, Agent, or Firm—W. F. Fasse; W. G. Fasse

(57) ABSTRACT

In a resin sealing method, a plurality of semiconductor chips are placed in line on a sheet-type substrate with an adhesive tape, and electrodes provided on the semiconductor chips and the sheet-type substrate are connected with each other with wires, so that the connected substrate is fixed to a mold surface of a lower mold. Then, the lower mold and an upper mold are closed and thereafter molten resin is injected into upper cavities and lower cavities provided in line respectively and hardened. Then, the upper and lower molds are opened to take out the sheet-type substrate having the plurality of semiconductor chips sealed thereto, and the sheet-type substrate is cut along the boundaries between the semiconductor chips by dicing for completing each package. According to this method, particularly a BOC type CSP can be efficiently sealed with resin in high dimensional accuracy.

15 Claims, 11 Drawing Sheets

RESIN SEALING METHOD AND RESIN SEALING APPARATUS

BACKGROUND OF THE INVENTION

1. Field of the Invention

The present invention relates to a resin sealing method and a resin sealing apparatus for electrically connecting electrodes provided on a substrate and a semiconductor chip fixed to the substrate with each other and thereafter sealing the semiconductor chip and the substrate with resin, and more particularly, it relates to a resin sealing method and a resin sealing apparatus excellent in workability.

2. Description of the Prior Art

In recent years, miniaturization is strongly required to a package having a semiconductor chip. Therefore, the so-called CSP (chip size package) is widely employed. Further, a BOC (board on chip) type CSP is employed in order to minimize the lengths of wires in the package for satisfying requirement for a high-speed operation of an electronic apparatus. In the BOC type CSP, a substrate having an opening is placed on a semiconductor chip so that a pad provided on the upper surface of the substrate is connected with a pad provided on the upper surface of the semiconductor chip through the opening with a wire or a metal strip.

Conventional resin sealing employed for a BOC type CSP is now described with reference to FIG. 11. FIG. 11 is a sectional view showing a finished product, i.e., a package sealed with resin by a conventional resin sealing method and a conventional resin sealing apparatus. As shown in FIG. 11, a semiconductor chip 100 is fixed to a substrate 102 with an adhesive tape 101. A wire 103 electrically connects a pad (not shown) of the semiconductor chip 100 with a pad (not shown) of the substrate 102 through an opening provided in the substrate 102. The pad of the substrate 102 is electrically connected with an external terminal 104, and a solder bump 105, i.e., a protruding electrode is provided on the external terminal 104 for transmitting/receiving signals to/from an external device. Further, the pads provided on the semiconductor chip 100 and the substrate 102 respectively and the wire 103 connecting these pads with each other are covered with sealing resin 106 hardened after potting.

The package shown in FIG. 11 is generally prepared in the following manner: First, the adhesive tape 101 is aligned with and stuck on the substrate 102. Then, the substrate 102 and the semiconductor chip 100 are aligned with each other and thereafter fixed to each other with the adhesive tape 101. Then, the pads of the substrate 102 and the semiconductor chip 100 are electrically connected with each other by wire bonding, i.e., with the wire 103 through the opening of the substrate 102. The opening of the substrate 102 is potted with molten resin for covering a connected portion formed by the pads of the substrate 102 and the semiconductor chip 100 and the wire 103 with a dispenser, and thereafter hardened for forming the sealing resin 106 and sealing the connected portion. Finally, the solder bump 105 is formed on the external terminal 104 of the substrate 102.

According to the conventional resin sealing method and the conventional resin sealing apparatus described above, however, each semiconductor chip 100 is potted with molten resin and hence the efficiency of resin sealing is hard to improve. While the efficiency of resin sealing can be improved by simultaneously using a plurality of dispensers, the resin sealing apparatus is remarkably complicated in this case.

In order to pot the connected portion, further, the viscosity of the molten resin must be reduced to some extent. Therefore, the molten resin spreads to lower dimensional accuracy in resin sealing. Further, the area required for resin sealing is increased to disadvantageously hinder miniaturization of the package.

SUMMARY OF THE INVENTION

An object of the present invention is to provide a resin sealing method and a resin sealing apparatus capable of manufacturing a miniature package in high precision by forming a cavity around a connected portion where pads of a semiconductor chip and a substrate are electrically connected with each other by closing molds, injecting molten resin into the cavity and hardening the same thereby efficiently sealing the package with resin.

In order to attain the aforementioned object, a resin sealing method according to an aspect of the present invention, fixing a substrate having an opening to a semiconductor chip with first and second mold portions arranged in a manner where a mold surface of the first mold portion is opposite to a mold surface of the second mold portion, electrically connecting an electrode provided on the semiconductor chip with an electrode provided on the substrate through the opening by a metal conductor including a metal thin wire or a metal strip previously provided on the substrate and thereafter sealing prescribed portions of the substrate and/or the semiconductor chip, comprises steps of placing the substrate on the second mold portion for storing a connected portion including each electrode and the metal conductor in a cavity provided on the mold surface of the first mold portion, closing the first mold portion and the second mold portion for thereafter injecting molten resin into the cavity and hardening the molten resin, and opening the first mold portion and the second mold portion and thereafter taking out the substrate having the semiconductor chip sealed thereto on the connected portion.

According to this method, resin sealing can be performed in excellent dimensional accuracy with a small occupied area by defining a cavity around the connected portion formed by the electrodes of the semiconductor chip and the substrate and the metal thin wire or the metal strip by closing the first and second mold portions, injecting molten resin into the cavity and hardening the same.

In an embodiment of this resin sealing method, the semiconductor chip is further stored in another cavity provided on the mold surface of the second mold portion in the step of placing the substrate on the second mold portion, and the molten resin is injected also into the cavity provided on the mold surface of the second mold portion and hardened in the hardening step.

According to this step, the molten resin is also injected into and hardened in the cavity provided on the second mold portion for storing the semiconductor chip, whereby resin sealing can be performed to cover the semiconductor chip. Therefore, the semiconductor chip can be inhibited from chipping after the resin sealing.

A resin sealing method according to another aspect of the present invention, fixing a plurality of semiconductor chips to a substrate having one or a plurality of openings with first and second mold portions arranged in a manner where a mold surface of the first mold portion is opposite to a mold surface of the second mold portion, electrically connecting electrodes provided on the plurality of semiconductor chips with an electrode provided on the substrate through the opening(s) by a metal conductor including a metal thin wire or a metal strip previously provided on the substrate and thereafter sealing prescribed portions of the substrate and/or each of said semiconductor chip areas, comprises steps of placing the substrate on the second mold portion while directing the plurality of semiconductor chips downward for storing a connected portion including each electrode and the metal conductor in a cavity provided on the mold surface of the first mold portion, closing the first mold portion and the second mold portion for thereafter injecting molten resin into the cavity and hardening the molten resin, and opening the first mold portion and the second mold portion and thereafter taking out the substrate having the plurality of semiconductor chips sealed thereto in each connected portion.

According to this resin sealing method, a plurality of semiconductor chips are fixed to a single substrate and a cavity is defined around the connected portion formed by the electrodes of each semiconductor chip and the substrate and the metal thin wire or the metal strip by closing the first and second mold portions for injecting molten resin into the cavity and hardening the same, whereby resin sealing can be efficiently performed.

In an embodiment of this resin sealing method, the plurality of semiconductor chips are further stored in another cavity provided on the mold surface of the second mold portion in the step of placing the substrate on the second mold portion, and the molten resin is injected also into the cavity provided on the mold surface of the second mold portion and hardened in the step of injecting and hardening the molten resin.

According to this step, the molten resin is also injected into and hardened in the cavity provided on the second mold portion for storing the plurality of semiconductor chips, whereby resin sealing can be performed to cover these semiconductor chips. Therefore, the plurality of semiconductor chips can be inhibited from chipping after the resin sealing.

In this resin sealing method, the molten resin is preferably so injected that pressure in the cavity provided on the mold surface of the second mold portion is higher than pressure in the cavity provided on the mold surface of the first mold portion in the step of injecting and hardening the molten resin.

According to this step, the molten resin injected into the cavity provided on the second mold portion presses the semiconductor chips against the first mold portion, while the cavity of the first mold portion for storing the connected portion is smaller than the cavity of the second mold portion storing the semiconductor chips. Thus, the semiconductor chips and the substrate can be inhibited from deformation resulting from force pressing the semiconductor chips against the first mold portion. Therefore, stress applied to the connected portion of the electrodes of the semiconductor chips and the metal conductor can be reduced for improving reliability of connection.

Thus, the resin sealing method attains an excellent practical effect of efficiently performing resin sealing in excellent dimensional accuracy with a small occupied area while improving reliability after resin sealing.

A resin sealing method according to still another aspect of the present invention, fixing a plurality of substrates each having an opening to a plurality of semiconductor chip areas provided on a wafer respectively with first and second mold portions arranged in a manner where a mold surface of the first mold portion is opposite to a mold surface of the second mold portion, electrically connecting electrodes provided on the semiconductor chip areas with electrodes provided on the substrates through the openings by metal conductors including metal thin wires or metal strips previously provided on the substrates respectively and thereafter sealing prescribed portions of each of the substrates and/or each of the semiconductor chip areas, comprises steps of placing the wafer on the second mold portion for storing a connected portion including each electrode and each metal conductor in a cavity provided on the mold surface of the first mold portion, closing the first mold portion and the second mold portion for thereafter injecting molten resin into the cavity and hardening the molten resin, and opening the first mold portion and the second mold portion and thereafter taking out the wafer in a state sealing prescribed portions of said wafer and/or each of said semiconductor chip areas the substrates to the semiconductor chip areas in each connected portion.

According to this resin sealing method, the plurality of substrates each having an opening are fixed onto the semiconductor chip areas of the wafer respectively and a cavity is defined around the connected portion formed by the electrodes of each semiconductor chip area and each substrate and the metal conductor by closing the fist and second mold portions for injecting the molten resin into the cavity and hardening the same. Therefore, the semiconductor chip areas and the substrates can be more efficiently sealed with the resin in the wafer state.

In an embodiment of this resin sealing method, the plurality of semiconductor chip areas are further stored in another cavity provided on the mold surface of the second mold portion in the step of placing the wafer on the second mold portion, and the molten resin is injected also into the cavity provided on the mold surface of the second mold portion and hardened in the step of injecting and hardening the molten resin.

According to this step, the molten resin is injected also into the cavity provided on the second mold portion for storing the semiconductor chip areas and hardened, whereby resin sealing can be performed to cover the semiconductor chip areas and the semiconductor chip areas can be inhibited from chipping after the resin sealing.

In this resin sealing method, the molten resin is preferably so injected that pressure in the cavity provided on the mold surface of the second mold portion is higher than pressure in the cavity provided on the mold surface of the first mold portion in the step of injecting and hardening the molten resin.

According to this step, the molten resin injected into the cavity provided on the second mold portion presses the semiconductor chip areas against the first mold portion. The cavity of the first mold portion for storing the connected portion is smaller than the cavity of the second mold portion storing the plurality of semiconductor chip areas. Thus, the plurality of semiconductor chip areas and the substrates can be inhibited from deformation resulting from force pressing the semiconductor chip areas against the first mold portion, and stress applied to the connected portion of the electrodes of each of the plurality of semiconductor chip areas and the metal conductor can be reduced for improving reliability of connection.

Thus, the resin sealing method attains an excellent practical effect of efficiently performing resin sealing in excellent dimensional accuracy with a small occupied area while improving reliability after resin sealing.

A resin sealing method according to a further aspect of the present invention, fixing a substrate having a plurality of openings to a wafer having a plurality of semiconductor chip areas with first and second mold portions arranged in a manner where a mold surface of the first mold portion is opposite to a mold surface of the second mold portion, electrically connecting electrodes provided on the semiconductor chip areas with an electrode provided on the substrate through the openings by a metal conductor including a metal thin wire or a metal strip previously provided on the substrate respectively and thereafter sealing prescribed portions of said wafer and/or each of the semiconductor chip areas, comprises steps of placing the wafer on the second mold portion for storing a connected portion including each electrode and the metal conductor in a cavity provided on the mold surface of the first mold portion, closing the first mold portion and the second mold portion for thereafter injecting molten resin into the cavity and hardening the molten resin, and opening the first mold portion and the second mold portion and thereafter taking out the wafer having the substrate sealed thereto on each connected portion.

According to this resin sealing method, the substrate having a plurality of openings is fixed onto the wafer and a cavity is defined around the connected portion formed by the electrodes of each semiconductor chip area and the substrate and the metal conductor by closing the first and second mold portions for injecting the molten resin into the cavity and hardening the same, whereby the semiconductor chip areas and the substrate can be more efficiently sealed with the resin in the wafer state.

A resin sealing apparatus according to a further aspect of the present invention, sealing a semiconductor chip to a substrate having an opening with first and second mold portions arranged in a manner where a mold surface of the first mold portion is opposite to a mold surface of the second mold portion, comprises an first mold portion provided with a cavity on its mold surface for storing a connected portion where an electrode provided on the substrate is electrically connected with an electrode provided on the semiconductor chip through the opening in the cavity, a second mold portion for receiving the semiconductor chip having the substrate fixed thereto, and a resin flowing part for injecting molten resin into the cavity after closing the first mold portion and the second mold portion.

According to this resin sealing apparatus, the semiconductor chip having the substrate fixed thereto is placed on the second mold portion, and the cavity storing the connected portion where the substrate and the semiconductor chip are electrically connected with each other is provided on the first mold portion, and the molten resin is injected into and hardened in the cavity after closing the first and second mold portions. Therefore, the resin hardened in the cavity seals the connected portion in excellent dimensional accuracy with a small occupied area.

A resin sealing apparatus according to a further aspect of the present invention, sealing a semiconductor chip area provided on a wafer to a substrate having an opening with first and second mold portions arranged in a manner where a mold surface of the first mold portion is opposite to a mold surface of the second mold portion, comprises an first mold portion provided with a cavity on its mold surface for storing a connected portion where an electrode provided on the substrate is electrically connected with an electrode provided on the semiconductor chip area through the opening in the cavity, a second mold portion for receiving the wafer having the substrate fixed thereto, and a resin flowing part for injecting molten resin into the cavity after closing the first mold portion and the second mold portion.

According to this resin sealing apparatus, the cavity storing the connected portion where the semiconductor chip area provided on the wafer and the substrate are electrically connected with each other is provided on the first mold portion, and the molten resin is injected into and hardened in the cavity after closing the first and second mold portions. Therefore, the wafer is efficiently sealed with the resin in excellent dimensional accuracy with a small occupied area.

Thus, the resin sealing apparatus attains an excellent practical effect of efficiently performing resin sealing in excellent dimensional accuracy with a small occupied area.

In the resin sealing method and apparatus of the present invention, another cavity for storing said semiconductor chip area may be further provided on the mold surface of the second mold portion, and the resin flowing part may inject the molten resin also into the another cavity provided on the second mold portion.

By means of adopting such a structure, sealing resin is further formed to cover the semiconductor chip area, thereby inhibiting the semiconductor chip area from chipping after resin sealing and, as a result, reliability after resin sealing is further improved.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
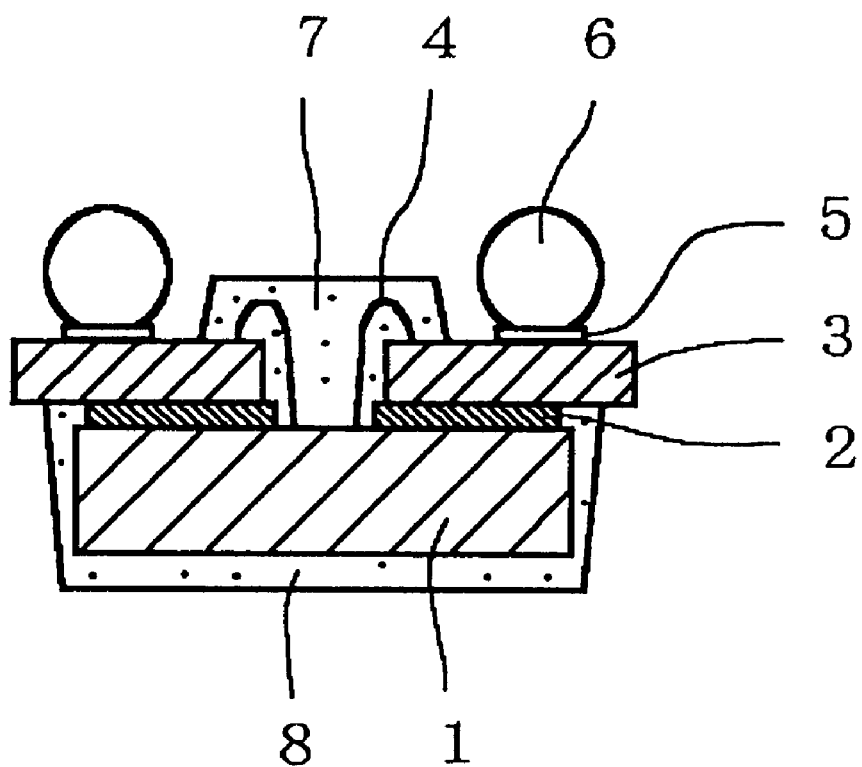
FIG. 1 is a sectional view showing a finished product, i.e., a package sealed with resin by a resin sealing method according to a first embodiment of the present invention.

A first embodiment of the present invention is now described with reference to FIGS. 1 to 4. FIG. 1 is a sectional view showing a finished product, i.e., a package sealed with resin by a resin sealing method according to the first embodiment.

As shown in FIG. 1, a semiconductor chip 1 is fixed to a substrate 3 of a glass epoxy plate or a polyimide film, for example, having a wire with an adhesive tape 2. A wire 4 of gold, for example, electrically connects a pad (not shown) of the semiconductor chip 1 with a pad (not shown) of the substrate 3. In the substrate 3, the wire electrically connects the pad with an external terminal 5, on which a solder bump 6, i.e., a protruding electrode is provided for transmitting/receiving signals to/from an external device. A connected portion formed by the pads provided on the semiconductor chip 1 and the substrate 3 respectively and the wire 4 connecting the pads with each other is covered with hardened upper sealing resin 7. Further, hardened lower sealing resin 8 covers the side and lower surfaces of the semiconductor chip 1, in order to suppress warpage in resin sealing, prevent the semiconductor chip 1 from chipping in a later step and inhibit the package itself from warpage resulting from heating when mounting the package on a printed circuit board or the like.

Figure 2:
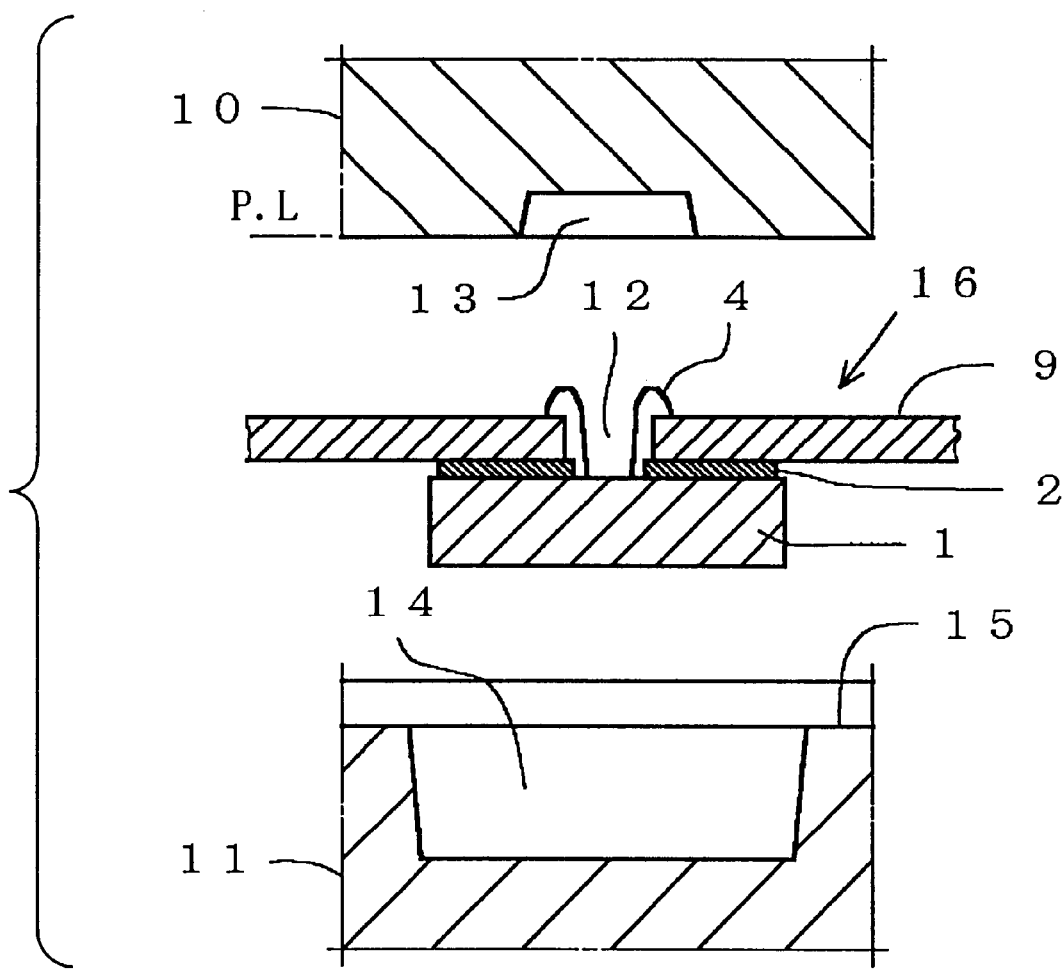
FIG. 2 is a sectional view showing a state around a single semiconductor chip before closing upper and lower molds in the resin sealing method and a resin sealing apparatus according to the first embodiment of the present invention.

The resin sealing method and a resin sealing apparatus for completing the package shown in FIG. 1 is now described with reference to FIGS. 2 and 3. FIG. 2 is a sectional view showing a state around a single semiconductor chip 1 before closing molds in the resin sealing method and the resin sealing apparatus according to the first embodiment. In advance of a resin sealing step, the adhesive tape 2 fixes the semiconductor chip 1 to a sheet-type substrate 9 and the wire 4 electrically connects the pads of the semiconductor chip 1 and the sheet-type substrate 9 with each other.

The sheet-type substrate 9 may be formed by a substrate provided with only one substrate 3 shown in FIG. 1 or the so-called multiple substrate provided with a plurality of such substrates serially connected with each other along the horizontal and depth directions of FIG. 2. The sheet-type substrate 9 is individually supplied in the form of a plate or a film, or continuously supplied in the form of a film from a reel.

The resin sealing apparatus according to this embodiment comprises an upper mold 10 and a lower mold 11. The upper mold 10 is provided with an upper cavity 13 defined by a single continuous concave portion in correspondence to an opening 12 provided on each of substrates serially aligned with each other along the depth direction of the sheet-type substrate 9. The lower mold 11 is provided with a lower cavity 14 defined by a single continuous concave portion, to completely cover the semiconductor chip 1 fixed to each of the substrates serially aligned with each other along the depth direction of the sheet-type substrate 9. The sheet-type substrate 9 fixed to a mold surface 15 of the lower mold 11.

In the resin sealing method according to this embodiment, the sheet-type substrate 9 having the semiconductor chip 1 fixed thereto with the pads connected with each other, i.e., a connected substrate 16 is fed into the clearance between the upper mold 10 and the lower mold 11 previously heated to a prescribed temperature respectively. Then, the connected substrate 16 is placed on the mold surface 15 so that the semiconductor chip 1 is completely stored in the lower cavity 14.

Figure 3:
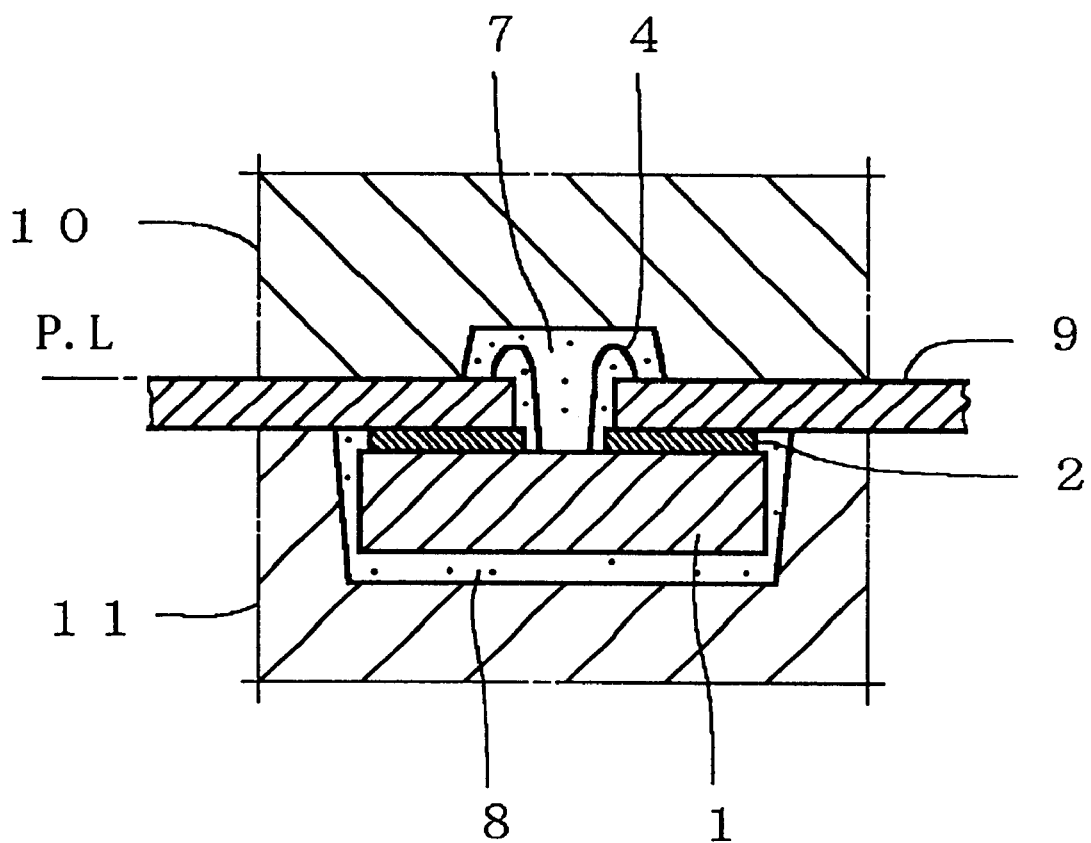
FIG. 3 is a sectional view showing such a state that molten resin is injected and hardened around the single chip after closing the upper and lower molds in the resin sealing method and the resin sealing apparatus according to the first embodiment of the present invention.

Then, the upper mold 10 and the lower mold 11 are closed as shown in FIG. 3. FIG. 3 is a sectional view showing such a state that molten resin is injected and hardened around the single semiconductor chip 1 after closing the upper and lower molds 10 and 11 in the resin sealing method and the resin sealing apparatus according to this embodiment. After closing the upper and lower molds 10 and 11, the molten resin is injected into the upper cavity 13 and the lower cavity 14 shown in FIG. 2 from this side toward the far side of FIG. 3 or vice versa and hardened. Thus, the connected portion formed by the pads (not shown) provided on the semiconductor chip 1 and the sheet-type substrate 9 respectively and the wire 4 is sealed with the upper sealing resin 7, while the semiconductor chip 1 is sealed with the lower sealing resin 8.

The molten resin is preferably injected into the upper cavity 13 and the lower cavity 14 shown in FIG. 2 so that no pressure is applied to the semiconductor chip 1 from the side of the sheet-type substrate 9. If pressure is applied from the side of the sheet-type substrate 9, downward force is applied to the semiconductor chip 1 stored in a space (the lower cavity 14 shown in FIG. 2) to convexly deform the semiconductor chip 1 and the sheet-type substrate 9 downward and possibly exert bad influence on the connected portion between the wire 4 and the pad of the semiconductor chip 1.

As a first method of avoiding application of such pressure, molten resin may be injected into the upper cavity 13 after filling the lower cavity 14 with molten resin. Thus, the downward force applied to the semiconductor chip 1 is suppressed.

Alternatively, pressure for injecting the molten resin into the lower cavity 14 may be controlled to be larger than that for injecting the molten resin into the upper cavity 13 as a second method of avoiding application of the aforementioned pressure. In this case, the semiconductor chip 1 is pressed against the upper mold 10 through the adhesive tape 2 and the sheet-type substrate 9, whereby no downward pressure is applied to the semiconductor chip 1 while upward force applied to the connected portion between the wire 4 and the pad of the semiconductor chip 1 is extremely reduced.

When employing either one of these methods, therefore, higher reliability can be kept as to the electrical connection between the wire 4 and the pad of the semiconductor chip 1.

Then, the upper mold 10 and the lower mold 11 are opened for taking out the sheet-type substrate 9 sealed with the resin. In this state, the sheet-type substrate 9 is formed with a narrow line of sealing resin, i.e., the upper sealing resin 7 sealing the connected portion on the side of the upper mold 10 and a wide line of sealing resin, i.e., the lower sealing resin 8 completely covering the semiconductor chip 1 on the side of the lower mold 11.

Further, the solder bump 6 (not shown) is formed on the external terminal 5 (not shown), and thereafter the sheet-type substrate 9 is separated into sections of a prescribed size along the boundary between the semiconductor chip 1 and another semiconductor chip adjacent thereto by dicing, for example. Thus, the package shown in FIG. 1 is completed.

According to this embodiment, as hereinabove described, the molten resin is injected into and hardened in the upper cavity 13 provided around the opening 12 of the substrate 3 and the lower cavity 14 provided around the semiconductor chip 1 with respect to the semiconductor chip 1 placed on the substrate 3 provided on the sheet-type substrate 9. Therefore, the semiconductor chip 1 and the substrate 3 can be sealed with sealing resin of a small size having high dimensional accuracy. When employing a sheet-type multiple substrate 9, a plurality of semiconductor chips 1 and a plurality of substrates 3 can be more efficiently sealed with resin.

Figure 4:
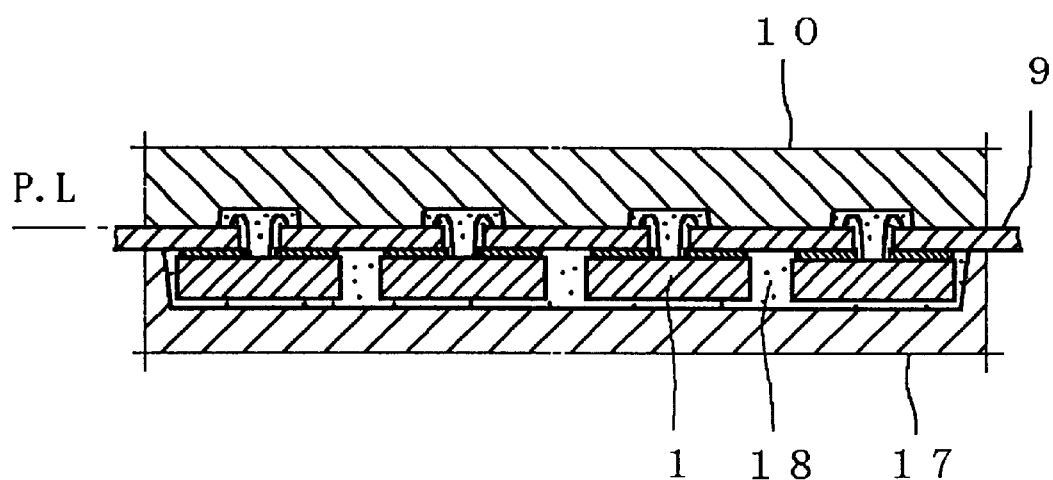
FIG. 4 is a sectional view showing a cavity is filled with resin in a modification of the resin sealing apparatus according to the first embodiment of the present invention.

FIG. 4 is a sectional view showing a cavity filled with resin in a modification of the resin sealing apparatus according to this embodiment. Referring to FIG. 2, the lower cavity 14 is provided on the lower mold 11 in correspondence to the overall semiconductor chips 1 serially aligned with each other along the depth direction. According to this modification, a wide lower cavity is provided on a lower mold 17 in correspondence to semiconductor chips 1 serially connected with each other in a plurality of lines (four lines in FIG. 4) along the depth direction, as shown in FIG. 4.

In this modification, an upper mold 10 and the lower mold 17 are closed and thereafter molten resin 18 is injected into the lower cavity from this side toward the far side of FIG. 4 or vice versa. After the molten resin 18 is hardened, the upper mold 10 and the lower mold 17 are opened for taking out a sheet-type substrate 9 sealed with the resin. Further, solder bumps (not shown) are formed on external terminals (not shown) and thereafter the sheet-type substrate 9 is separated into sections of a prescribed size along the boundaries between the semiconductor chips 1 by dicing, for example. Thus, packages having the semiconductor chips 1 respectively are completed.

According to this modification, the molten resin 18 is collectively injected into the wide lower cavity storing the plurality of lines of semiconductor chips 1. Thus, the molten resin 18 is more stably injected into the lower mold 17 as compared with the molten resin injected into the narrow lower cavity 14 and the narrower upper cavity 13 shown in FIG. 2. Also when the sheet-type substrate 9 is provided with a number of substrates along the depth direction of FIG. 4, therefore, the molten resin 18 can be reliably injected to sufficiently reach the most separated substrate for sealing the semiconductor chips 1.

Second Embodiment

Figure 5:
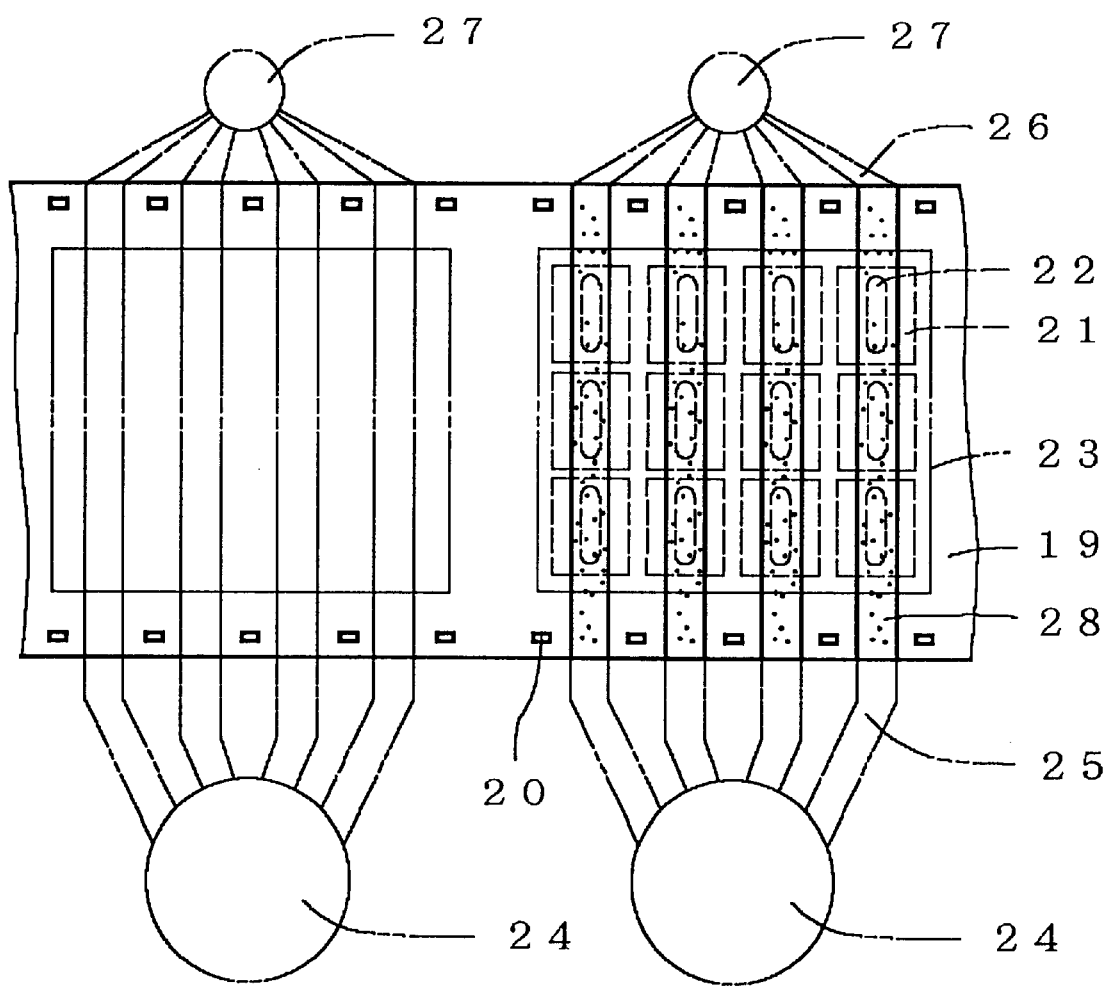
FIG. 5 a plan view, as viewed from the side of an upper mold, showing the positional relation between elements in resin sealing in a resin sealing apparatus according to a second embodiment of the present invention.

A second embodiment of the present invention is now described with reference to FIGS. 5 and 6. FIG. 5 a plan view, as viewed from the side of an upper mold, showing the positional relation between elements in resin sealing in a resin sealing apparatus according to this embodiment.

As shown in FIG. 5, the resin sealing apparatus according to this embodiment comprises a film-type substrate 19 formed by a plurality of unit substrates (each corresponding to the substrate 3 shown in FIG. 1), and sprocket holes 20 are provided on the film-type substrate 19 for supplying the same from a reel. A semiconductor chip 21 is placed on the lower surface of each unit substrate. Each unit substrate has an opening 22, and is sealed with resin through a single operation of the resin sealing apparatus on the film-type substrate 19 within the range of a resin-sealing area 23.

The resin sealing apparatus has cull portions 24, which are spaces provided on the upper mold for temporarily storing molten resin pressed by a plunger (not shown) from below, i.e., from the far side of FIG. 5.

Each of the upper mold and a lower mold is provided with a plurality of (in FIG. 5, four) supply runner portions 25 for each cull portion 24 as passages for the molten resin supplied from the cull portion 24. Each supply runner portion 25 supplies the molten resin to each of upper cavities provided on the upper mold to communicate with each other in lines (four lines in FIG. 5) for completely covering a connected portion where pads of each semiconductor chip and each unit substrate are connected with each other through a gate on the side of the upper mold. Further, each supply runner portion 25 supplies the molten resin to each of lower cavities provided on the lower mold to communicate with each other in lines (four lines in FIG. 5) for completely covering each semiconductor chip through a gate on the side of the lower mold.

Each of the upper and lower molds is provided with a plurality of (in FIG. 5, four) discharge runner portions 26 for each cull portion 24 as passages for excess molten resin discharged from the upper and lower cavities. Resin reservoirs 27 are spaces storing the excess molten resin discharged from the respective discharge runner portions 26.

The molten resin supplied to each upper cavity is hardened to form upper sealing resin 28. Similarly, lower sealing resin (not shown in FIG. 5) is formed to completely cover each semiconductor chip 21 on the side of the lower mold.

The resin sealing apparatus shown in FIG. 5 is provided with two sets of the portions located between the cull portions 24 and the resin reservoirs 27, in order to further improve the efficiency of resin sealing.

Resin sealing operations of the resin sealing apparatus according to this embodiment are now described with reference to FIG. 5.

First, the upper and lower molds are opened for feeding the film-type substrate 19 receiving the semiconductor chips 21 thereon into the clearance between the upper and lower molds. In this case, the semiconductor chips 21 are placed on the film-type substrate 19 previously taken up on the reel and wire-bonded so that the film-type substrate 19 is thereafter supplied to the resin sealing apparatus.

Then, the upper and lower molds are heated and the molten resin is pressed with the plunger (not shown) from below, i.e., from the far side of FIG. 5. Thus, the molten resin is injected into each lower cavity and each upper cavity from the gates through the cull portions 24 and each supply runner portion 25. Also after a pair of lower and upper cavities are entirely filled with the molten resin, the plunger continuously presses the molten resin from below.

When all lower and upper cavities are filled with the molten resin, the upper and lower molds are further heated for hardening the molten resin filled in each lower cavity and each upper cavity.

Then, the upper and lower molds are opened for taking out the film-type substrate 19 sealed with the resin on both surfaces, and the film-type substrate 19 is thereafter separated into sections of a prescribed size along the boundaries between the semiconductor chips 21 by dicing, for example. Thus, packages having the semiconductor chips 21 respectively are completed.

As described with reference to the first embodiment, the upper cavities are preferably filled with the molten resin after filling the lower cavities with the molten resin, in order to keep high reliability as to the electrical connection between wires (not shown) and pads (not shown) of the semiconductor chips 21. In order to implement this, a shutter may be provided on the upper mold side of each supply runner portion 25, for example, for filling the lower cavities with the molten resin while closing the shutter, thereafter opening the shutter and filling the upper cavities with the molten resin. Thus, downward force applied to the semiconductor chips 21 is suppressed so that high reliability can be kept as to the electrical connection between the wires and the pads of the semiconductor chips 21.

Figure 6:
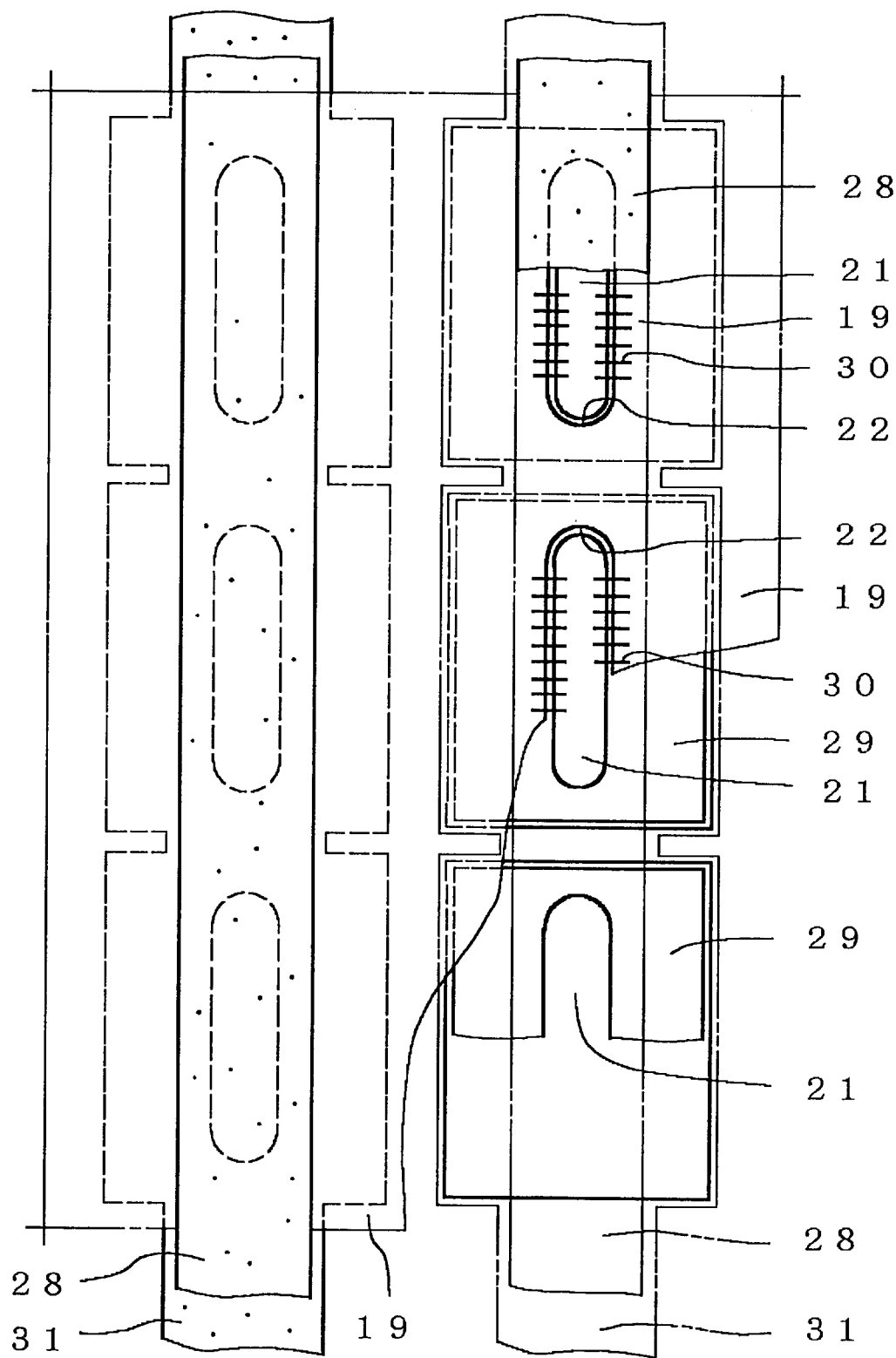
FIG. 6 is a plan view, as viewed from the side of the upper mold, showing the structure of a film-type substrate sealed with resin in the second embodiment of the present invention while partially omitting illustration of elements.

FIG. 6 is a plan view, as viewed from the side of the upper mold, showing the structure of the film-type substrate 19 sealed with resin in this embodiment while partially omitting illustration of elements. As shown in FIG. 6, the semiconductor chips 21 are fixed to the lower surface of the film-type substrate 19 with adhesive tapes 29. Wires 30 electrically connect the pads of the semiconductor chips 21 and the film-type substrate 19 with each other through the openings 22 of the film-type substrate 19. The upper sealing resin 28 provided in line seals the peripheries of connected portions formed by the pads and the wires 30, while lower sealing resin 31 provided in line seals the peripheries of the semiconductor chips 21.

According to this embodiment, as hereinabove described, each supply runner portion 25 is provided to seal a plurality of semiconductor chips 21 with resin. Further, the portions located between the cull portion 24 and the resin reservoir 27, i.e., the supply runner portions 25, the lower and upper cavities and the discharge runner portions 26 are plurally provided for a single cull portion 24. Therefore, each semiconductor chip 21 placed on the multiple film-type substrate 19 is efficiently sealed with resin.

While each cull portion 24 is provided for each resin sealing area 23, the present invention is not restricted to this but two cull portions 24 may alternatively be provided for each resin sealing area 23. In this case, the two cull portions 24 may be arranged on the same side (e.g., the side provided with the cull portion 24 in FIG. 5) of the film-type substrate 19 for supplying the molten resin to the upper and lower cavities respectively, or may be arranged on both sides of the film-type substrate 19. In this case, the pressure and timing for injecting the molten resin into the lower and upper cavities can be readily controlled. Therefore, high reliability can be kept as to the electrical connection between the wires 30 and the pads of the semiconductor chips 21.

As shown in FIG. 6, a hole of each adhesive tape 29 and each opening 22 of the film-type substrate 19 are provided within the outer periphery of each semiconductor chip 21. Alternatively, the hole of each adhesive tape 29 and each opening 22 of the film-type substrate 19 may extend beyond the outer periphery of each semiconductor chip 21. Further alternatively, the hole of each adhesive tape 29 and each opening 22 of the film-type substrate 19 communicating with each other may be provided for a plurality of semiconductor chips 21 present in each lower cavity.

In this case, the molten resin is flowable between the lower and upper cavities through the holes of the adhesive tape 29 and the openings 22 of the film-type substrate 19 between the semiconductor chips 21. Thus, the molten resin is injected from the lower cavities into the upper cavities between the semiconductor chips 21 without providing portions connected with the upper cavities on the supply runner portions 25. Therefore, the upper and lower molds are simplified while the molten resin injected into the lower cavities presses the semiconductor chips 21 and the film-type substrate 19 against the upper mold, whereby high reliability can be kept as to the electrical connection between the wires 30 and the pads of the semiconductor chips 21.

While this embodiment has been described with reference to the film-type substrate 19, glass epoxy substrates or the like may be substitutionally employed. In this case, the substrates may be fed one by one to the clearance between the upper and lower molds.

While the lower cavities are provided in lines on each resin sealing area 23, a lower cavity may alternatively be provided to cover the overall lower surface of the resin sealing area 23. In this case, the molten resin is injected into a wide lower cavity on the lower surface of the resin sealing area 23 dissimilarly to the case of injecting the molten resin into each of narrow lower cavities, whereby resin sealing can be stably performed.

Third Embodiment

Figure 7:
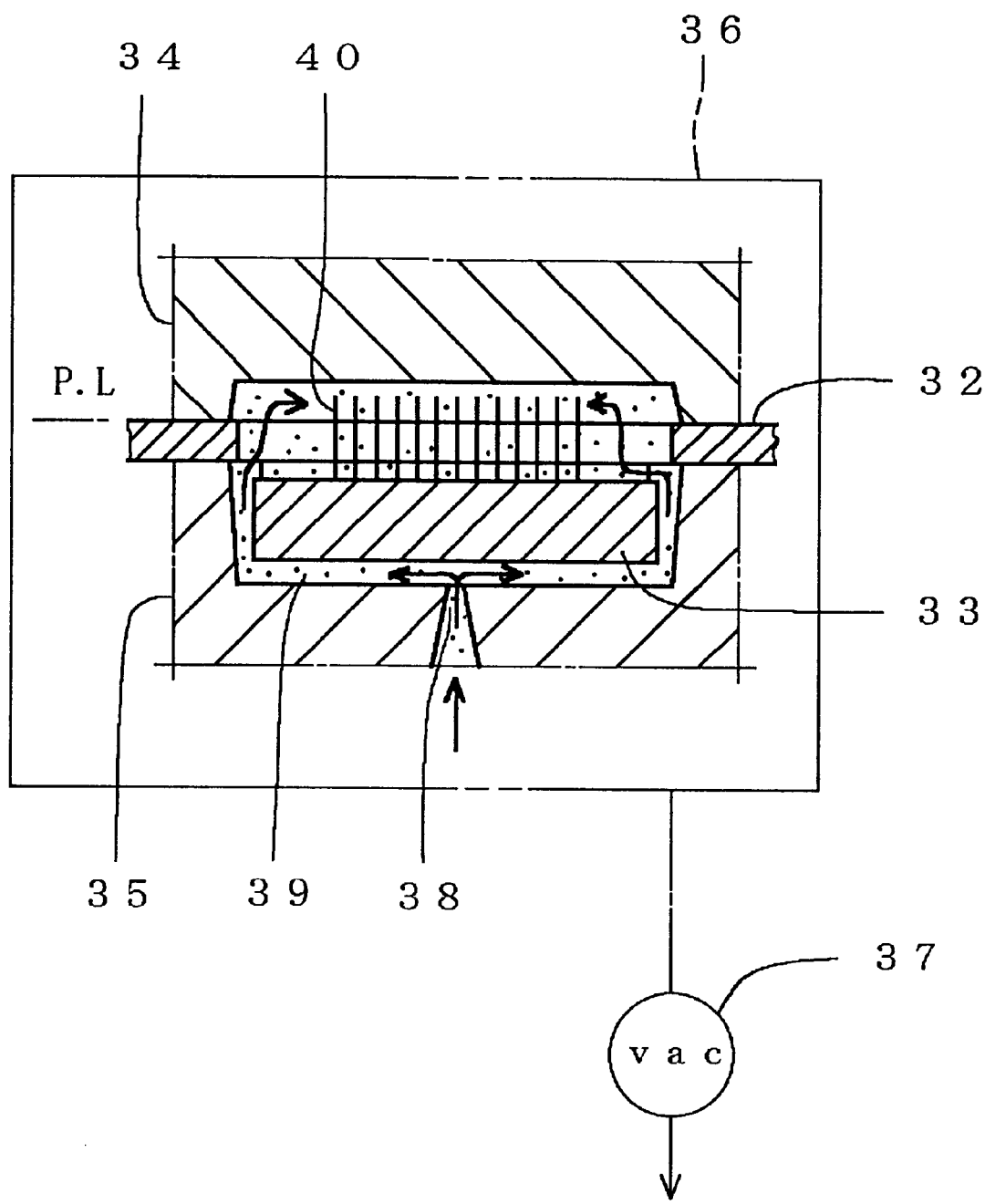
FIG. 7 is a sectional view showing cavities filled with resin in a resin sealing apparatus according to a third embodiment of the present invention.

A third embodiment of the present invention is now described with reference to FIG. 7. FIG. 7 is a sectional view showing cavities filled up with resin in a resin sealing apparatus according to this embodiment.

As shown in FIG. 7, a semiconductor chip 33 is placed on a sheet-type substrate 32 and an upper mold 34 and a lower mold 35 are closed so that a vacuum pump 37 decompresses an area 36 including cavities defined by closing the upper and lower molds 34 and 35. Molten resin 39 is injected from a gate 38 provided on the lower mold 35 toward a substantially central portion of the lower surface of the semiconductor chip 33. The injected molten resin 39 flows from the cavity of the lower mold 35 into the cavity of the upper mold 34 as shown by thick arrows in FIG. 7, to finally fill the cavities.

According to this embodiment, the molten resin 39 is injected from the gate 38 provided on the lower mold 35 under decompression, to fill the overall cavities. Thus, the molten resin 39 homogeneously flows in the cavities, whereby influence on a wire 40 is suppressed. Further, the molten resin 39 presses the semiconductor chip 33 from below, whereby high reliability can be kept as to the electrical connection between the wire 40 and a pad of the semiconductor chip 33.

Fourth Embodiment

Figure 8:
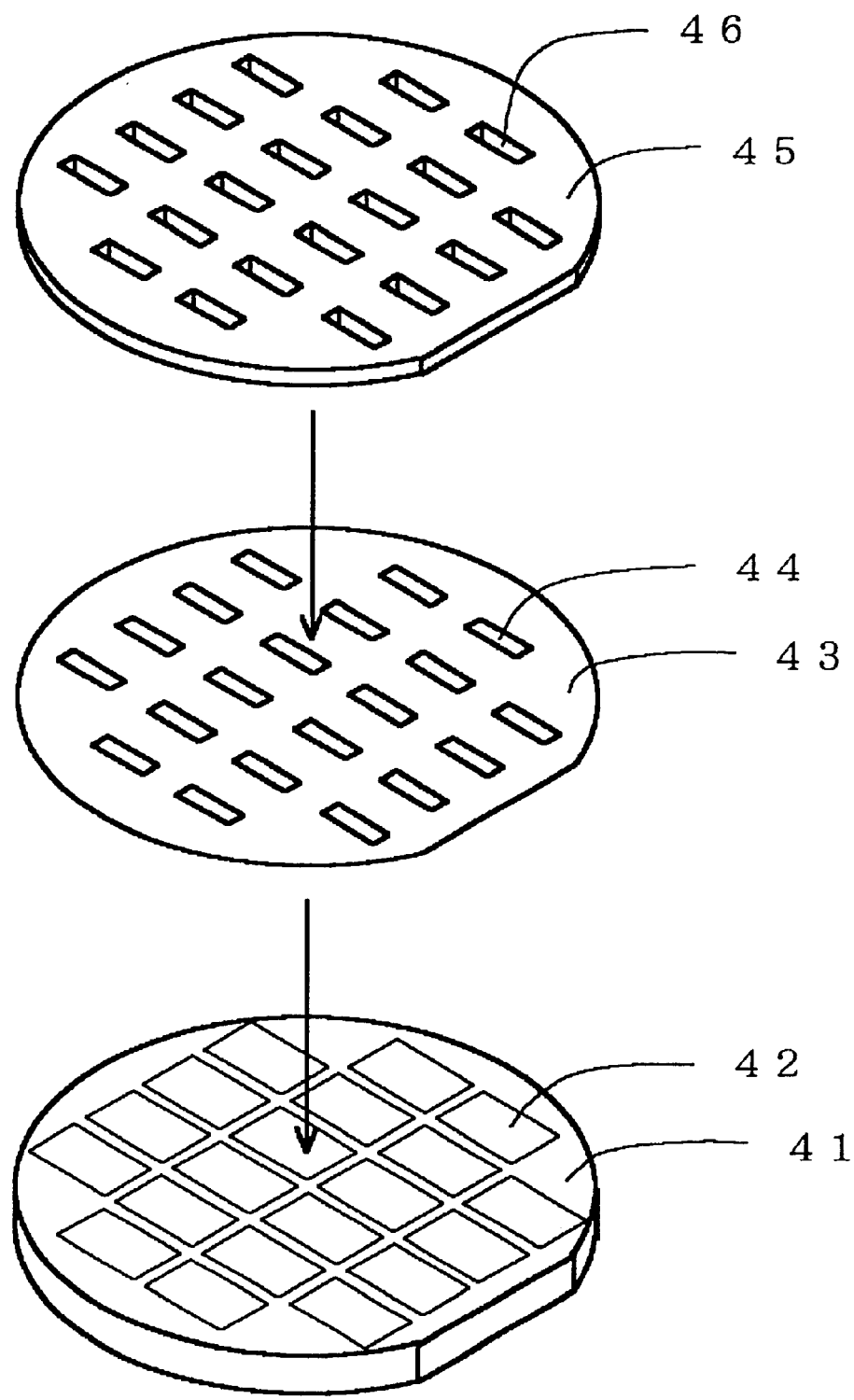
FIG. 8 is a perspective view showing the relation between a wafer having a plurality of chip areas, a sheet-type adhesive tape and a sheet-type substrate stacked with each other in a resin sealing method according to a fourth embodiment of the present invention.
Figure 9:
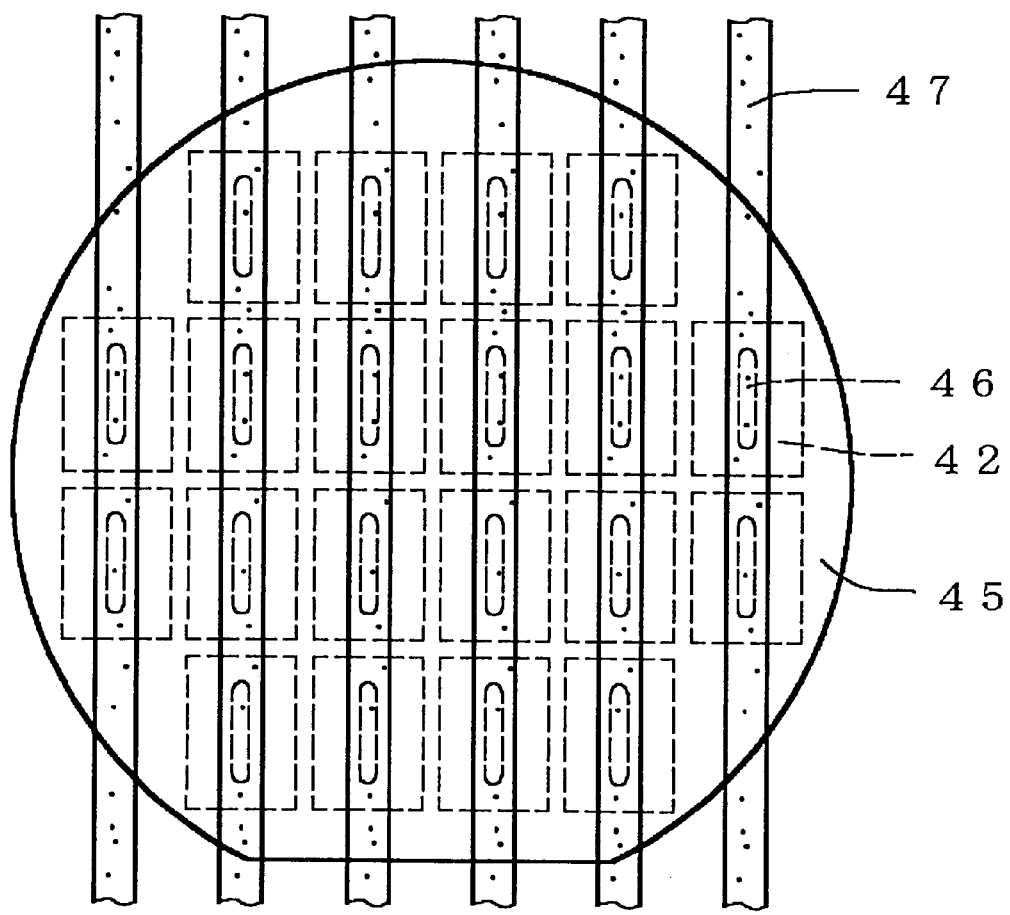
FIG. 9 is a plan view, as viewed from the side of an upper mold, showing sealing resin formed for the sheet-type substrate placed on the wafer in the resin sealing method according to the fourth embodiment of the present invention.

A fourth embodiment of the present invention is now described with reference to FIGS. 8 to 10. FIG. 8 is a perspective view showing the relation between a wafer 41 having a plurality of chip areas 42, a sheet-type adhesive tape 43 and a sheet-type substrate 45 stacked with each other in a resin sealing method according to this embodiment. FIG. 9 is a plan view, as viewed from the side of an upper mold, showing the sheet-type substrate 45 placed on the wafer 41 and formed with sealing resin. Referring to FIG. 8, a plurality of chip areas 42 are provided on the wafer 41 of silicon, for example, whereby the chip areas 42 will respectively form individual semiconductor chips after being separated from each other.

In the resin sealing method according to the present invention, holes 44 formed through the sheet-type adhesive tape 43 are aligned with the chip areas 42 of the wafer 41 respectively, for sticking the sheet-type adhesive tape 43 on the wafer 41.

Then, openings 46 provided on the sheet-type substrate 45 are aligned with the chip areas 42 of the wafer 41 respectively, for sticking the sheet-type substrate 45 on the wafer 41 through the sheet-type adhesive tape 43.

Then, pads of the sheet-type substrate 45 and the chip areas 42 are electrically connected with each other by wires.

Then, a semi-product formed by integrating the wafer 41 and the sheet-type substrate 45 with each other is placed between an upper mold and a lower mold and sealed with resin afer closing the upper and lower molds. Thus, upper sealing resin 47 and lower sealing resin (not shown) are formed for all chip areas 42 of the wafer 41.

Finally, the semi-product formed by integrating the wafer 41 and the sheet-type substrate 45 with each other is separated into sections of a prescribed size along the boundaries between the chip areas 42 by dicing, for example. Thus, packages having semiconductor chips respectively are completed.

Figure 10:
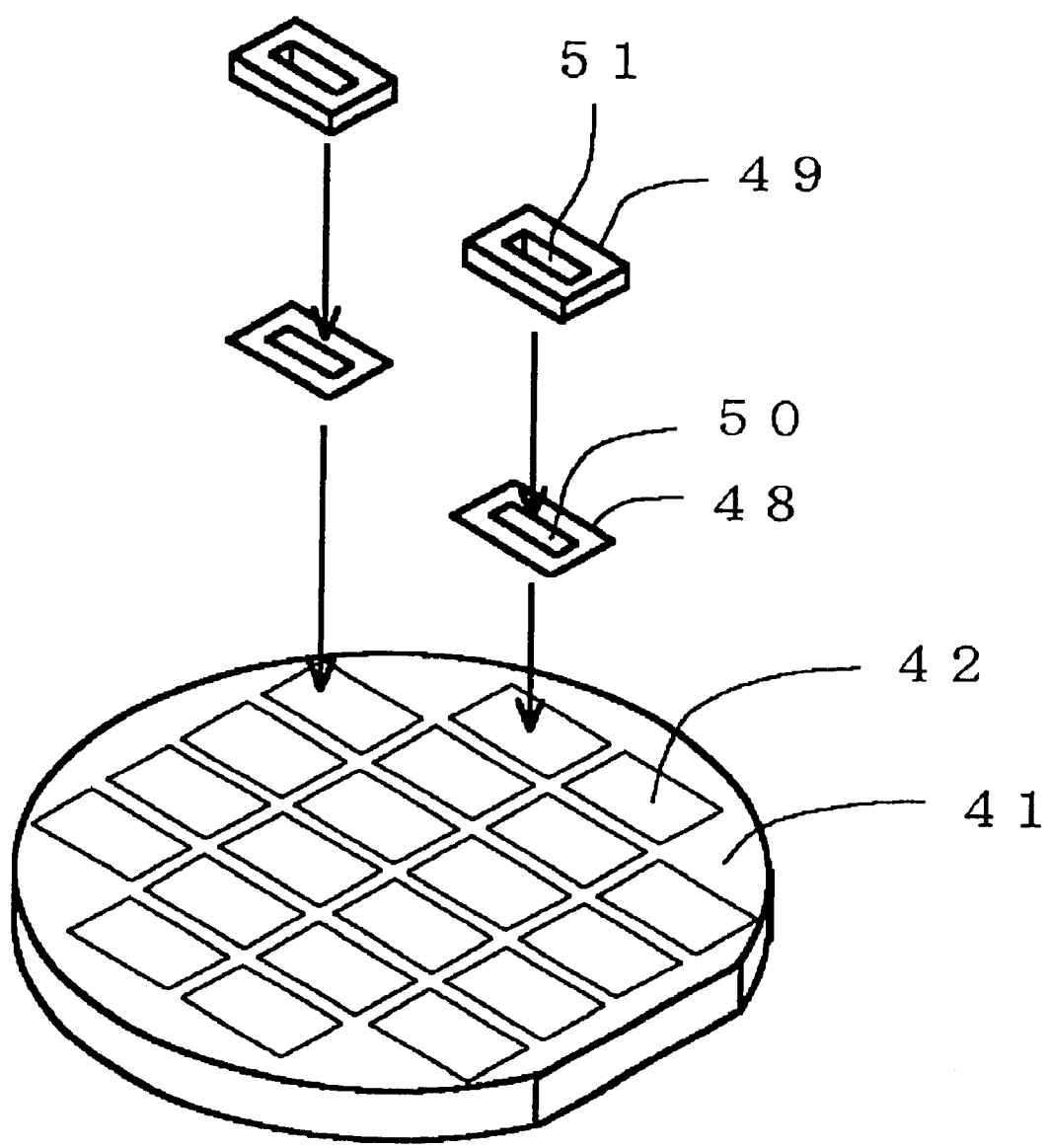
FIG. 10 is a perspective view showing the relation between a wafer having a plurality of chip areas, an adhesive tape and a substrate stacked with each other in a resin sealing method according to a modification of the fourth embodiment of the present invention.
Figure 11:
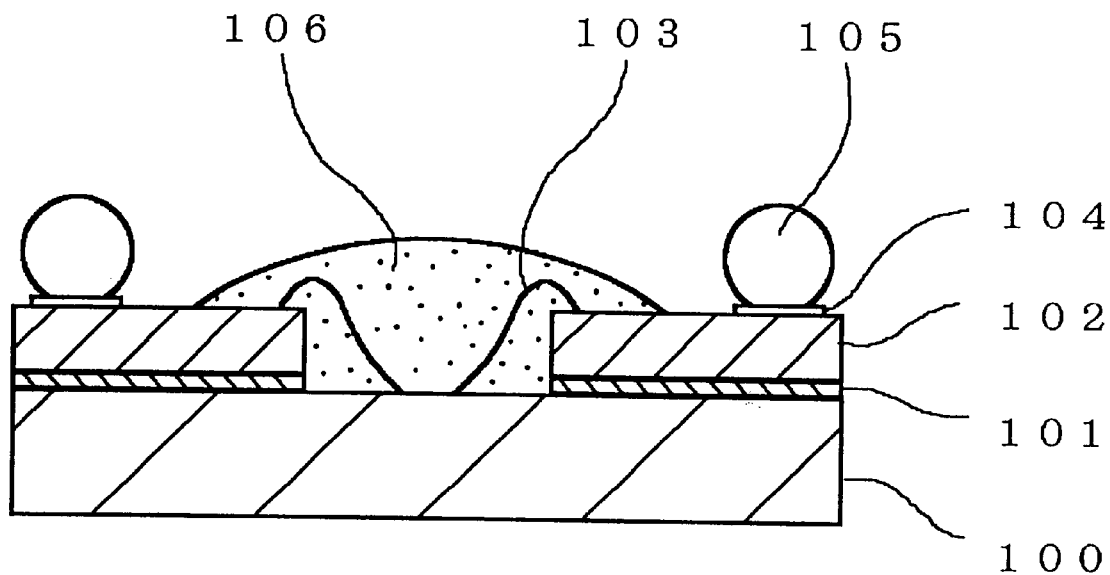
FIG. 11 is a sectional view showing a finished product, i.e., a package sealed with resin by a conventional resin sealing method and a conventional resin sealing apparatus.

FIG. 10 is a perspective view showing the relation between a wafer 41 having a plurality of chip areas 42, adhesive tapes 48 and substrates 49 stacked with each other in a resin sealing method according to a modification of this embodiment. This modification employs plural individual adhesive tapes 48 and plural individual substrates 49 previously separated to correspond to the individual chip areas 42 respectively, instead of the unitary sheet-type adhesive tape 43 and the unitary sheet-type substrate 45 employed in FIG. 8.

In the resin sealing method according to this modification, holes 50 formed through the adhesive tapes 48 are aligned with the chip areas 42 of the wafer 41 respectively, for sticking the adhesive tapes 48 on the chip areas 42 respectively.

Then, openings 51 provided on the substrates 49 are aligned with the chip areas 42 of the wafer 41 respectively, for sticking the substrates 49 on the chip areas 42 through the adhesive tapes 48 respectively. Thereafter wire bonding, resin sealing and dicing are successively performed similarly to the embodiment shown in FIG. 8, for completing packages having semiconductor chips respectively.

According to this embodiment, as hereinabove described, fixation of the substrate 45 or 49 and each chip area 42 formed on the wafer 41, electrical connection between pads of the substrate 45 or 49 and each chip area 42 and resin sealing are successively performed in the wafer state, and thereafter the wafer 41 is separated into the packages having semiconductor chips respectively. Therefore, the efficiency of steps for obtaining the packages from the wafer 41 can be remarkably improved.

In each of the aforementioned embodiments, the lower surface of each semiconductor chip or each chip area is covered with the sealing resin. However, the present invention is not restricted to this but only an upper cavity may be provided for sealing only a connected portion with resin when the ratio of chipping caused on the semiconductor chip in a later step or bad influence exerted by warpage in resin sealing or mounting is sufficiently small.

While the packages are completed by dicing, the present invention is not restricted to this but the sheet-type substrate, the film-type substrate or the sealing resin may be separated by punching with a die, cutting with a laser beam or the like.

The wires electrically connecting the pads of the semiconductor chip and the substrate may be replaced with metal strips previously provided on the substrate to project from the pad of the substrate, i.e., leads of metal foil.

In each of the aforementioned embodiments, a structure wherein the upper mold and the lower mold are mutually reversed can also be adopted.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A resin sealing method performed by using upper and lower molds arranged in a manner where a mold surface of said upper mold is opposite to a mold surface of said lower mold, comprising steps of:

fixing one substrate having a plurality of openings, or a plurality of substrates each having an opening, to a wafer having a plurality of semiconductor chip areas provided thereon for forming semiconductor chips after being separated from each other, in a manner wherein said openings correspond to said semiconductor chip areas;

electrically connecting electrodes provided on said semiconductor chip areas with electrodes provided on said substrate or substrates through said openings by metal conductors including metal thin wires or metal strips previously provided on said substrate or substrates respectively;

placing said wafer on said lower mold for storing a connected portion including each said electrode and each said metal conductor in a cavity provided on the mold surface of said upper mold;

closing said upper and lower molds;

injecting molten resin at least into said cavity and hardening said molten resin;

opening said upper and lower molds; and taking out said wafer in a state sealing said substrate or substrates to said semiconductor chip areas on each said connected portion.

2. The resin sealing method according to claim 1, wherein said plurality of semiconductor chip areas are further stored respectively in another cavity provided on the mold surface of said lower mold in said step of placing said wafer on said lower mold, and said molten resin is injected also into said another cavity provided on the mold surface of said lower mold and hardened in said step of injecting and hardening the molten resin.

3. The resin sealing method according to claim 1, further comprising a step of separating said wafer with said substrate or substrates fixed thereon into sections of a prescribed size by dicing along boundaries between said semiconductor chip areas, after said step of taking out the wafer.

4. The resin sealing method according to claim 2, wherein said molten resin is so injected that a pressure in said another cavity provided on the mold surface of said lower mold is higher than a pressure in said cavity provided on the mold surface of said upper mold in said step of injecting and hardening said molten resin.

5. The resin sealing method according to claim 2, wherein said molten resin is injected into said cavities of said upper and lower molds through resin supply runner portions provided in said upper and lower molds, in said step of injecting and hardening said molten resin.

6. A method of making a resin-sealed semiconductor product, comprising the following steps:

a) providing a molding apparatus including a first mold with a first mold surface and a second mold with a second mold surface, wherein said first and second molds are selectively openable and closeable relative to each other with said first and second mold surfaces facing each other, and wherein said first mold surface has plural first mold cavities therein;

b) providing a unitary semiconductor wafer including plural semiconductor chip areas adapted to form respective plural semiconductor chips by later dividing said wafer between said semiconductor chip areas, and having chip electrodes respectively on said semiconductor chip areas;

c) providing a substrate arrangement having plural openings and plural substrate electrodes, selected from the group consisting of a single unitary substrate having said plural openings therein and said plural substrate electrodes thereon, and plural individual substrates each respectively having a respective one of said plural openings therein and at least a respective one of said substrate electrodes thereon;

d) fixing said substrate arrangement onto said semiconductor wafer with said openings respectively in registration with said semiconductor chip areas, to form thereof an intermediate product;

e) electrically connecting said chip electrodes with said substrate electrodes by metal conductors respectively extending between said chip electrodes and said substrate electrodes through said openings;

f) arranging said intermediate product between said first and second molds with said semiconductor wafer facing said second mold surface and said substrate arrangement facing said first mold surface;

g) closing said first and second molds relative to each other so that said first mold cavities are respectively in registration with individual ones or groups of said openings, and so that said metal conductors, said substrate electrodes and said openings are respectively received and enclosed in said first mold cavities;

h) injecting molten resin into said first mold cavities and hardening said resin to encapsulate and seal said metal conductors, said substrate electrodes and said openings in said resin; and i) opening said first and second molds relative to each other and removing therefrom said intermediate product having said metal conductors, said substrate electrodes and said openings respectively encapsulated and sealed with said resin at each of said semiconductor chip areas.

7. The method according to claim 6, wherein, in said step g), said first mold cavities are respective elongated cavities that are respectively in registration with linearly aligned groups of said openings of said substrate arrangement.

8. The method according to claim 6, wherein said substrate arrangement comprises said single unitary substrate.

9. The method according to claim 6, wherein said substrate arrangement comprises said plural individual substrates.

10. The method according to claim 6, wherein said second mold surface has plural second mold cavities therein in registration with said first mold cavities of said first mold surface, said step g) further includes said second mold cavities being placed in registration with individual ones or groups of said semiconductor chip areas, and said step h) further includes injecting said molten resin into said second mold cavities and hardening said resin in said second mold cavities to encapsulate and seal said semiconductor chip areas on a surface of said wafer opposite said substrate arrangement.

11. The method according to claim 6, excluding a step of sealing with resin said semiconductor chip areas on a surface of said wafer opposite said substrate arrangement.

12. The method according claim 6, further comprising an additional step after said step i), of separating said intermediate product into individual packaged chips by dividing said intermediate product respectively between adjacent ones of said semiconductor chip areas of said wafer.

13. The method according to claim 8, wherein said step of fixing said substrate arrangement onto said semiconductor wafer comprises arranging and adhering a single unitary adhesive sheet having holes therein between said single unitary substrate and said semiconductor wafer with said holes in registration with said openings.

14. The method according to claim 9, wherein said step of fixing said substrate arrangement onto said semiconductor wafer comprises arranging and adhering plural individual adhesive tapes respectively having holes therein respectively between said plural individual substrates and said semiconductor wafer with said holes in registration with said openings.

15. The method according to claim 10, wherein said injecting of said molten resin into said second mold cavities is carried out at a higher pressure than said injecting of said molten resin into said first mold cavities.

* * * * *